United States Patent [19]

Miller et al.

[11] Patent Number: 5,753,971
[45] Date of Patent: May 19, 1998

[54] POWER SEMICONDUCTOR MODULE WITH TERMINAL PINS

[75] Inventors: Gerhard Miller, Penzing; Mario Feldvoss, Munich, both of Germany

[73] Assignee: Siemens Aktiengesellschaft, Munich, Germany

[21] Appl. No.: 663,743

[22] Filed: Jun. 14, 1996

[30] Foreign Application Priority Data

Jun. 19, 1995 [DE] Germany ............... 195 22 172.9

[51] Int. Cl.⁶ .............. H01L 23/48; H01L 23/02; H01L 23/52
[52] U.S. Cl. .............. 257/690; 257/678; 257/691; 257/692
[58] Field of Search ............... 257/690, 684, 257/691, 699, 700, 723, 787, 775, 692, 694, 696, 678, 689, 724

[56] References Cited

U.S. PATENT DOCUMENTS

| 5,466,969 | 11/1995 | Tsunoda ............... 257/706 |
| 5,519,252 | 5/1996 | Soyano et al. ............... 257/690 |

FOREIGN PATENT DOCUMENTS

| 92 03 000 U1 | 7/1992 | Germany. |
| 43 25 942 C2 | 5/1995 | Germany. |
| 59-121860 | 7/1984 | Japan ............... 257/703 |
| 2-187053 | 7/1990 | Japan ............... 257/703 |
| OS 3-34561 | 3/1991 | Japan. |

OTHER PUBLICATIONS

Siemens Product Specification, p. 35, 1993/94.

*Primary Examiner*—Mahshid D. Saadat
*Assistant Examiner*—Jhihan B. Clark
*Attorney, Agent, or Firm*—Hill, Steadman & Simpson

[57] ABSTRACT

A power semiconductor module including a housing that has a housing wall and a base on which the housing is disposed. A number of semiconductor components are disposed on the base. A terminal element includes a portion contained in the housing wall, at least two terminal pins projecting from the housing wall, and an exposed lower part projecting into the housing from the housing wall. The portion of the terminal element contained in the wall and the lower part of the terminal element have a cross-section that is larger than the sum of the cross-sections of each of the terminal pins. The lower part of the terminal element is electrically connected to at least one of the semiconductor components.

20 Claims, 1 Drawing Sheet

5,753,971

POWER SEMICONDUCTOR MODULE WITH TERMINAL PINS

BACKGROUND OF THE INVENTION

1. Field of the Invention

The invention concerns a power semiconductor module that is connected to circuit boards. In particular, the semiconductor module has a terminal element with at least two pins to accommodate a higher current-carrying capacity.

2. Description of the Prior Art

Power semiconductor modules having terminal elements are available on the market. The known power semiconductor module is constructed so that each terminal element ends in a single pin. The power semiconductor module may be connected to the circuit boards via the pin of the terminal element by flow soldering.

However, at higher currents, the current carrying capacity of the terminal elements is no longer sufficient to conduct the load current. One must switch over to terminal elements having a larger cross-sectional area. It is difficult to connect terminal elements having a larger cross-sectional area, with circuit boards by flow soldering. A simple perforation of the board is no longer sufficient. Slots must be punched corresponding to the cross-sectional area of the terminal element. In addition, attempts to connect terminal elements, having a larger cross-sectional area, to the circuit board by flow soldering have shown that the soldering joint was strongly non-homogeneous. The result is that the current carrying capacity of the terminal element having a single pin could not be exploited.

SUMMARY OF THE INVENTION

The primary object of the invention is to further develop a power semiconductor module that connects with circuit boards through flow soldering even when the power semiconductor module is dimensioned for higher currents.

This object is achieved by developing a terminal element consisting of at least two pins.

The terminal elements are formed rectangularly in the lower part and inside the wall, and have a larger cross-sectional area than the sum of the cross-sectional areas of each of the pins.

The current carrying capacity of such an arrangement exceeds the current carrying capacity of an arrangement in which the terminal elements are soldered with the board with their rectangular cross-section.

Further constructions of the invention are the subject matter of the subclaims. The invention is specified more precisely on the basis of an exemplary embodiment in connection with FIGS. 1 and 2.

DETAILED DESCRIPTION OF THE EMBODIMENTS

Figure 1:
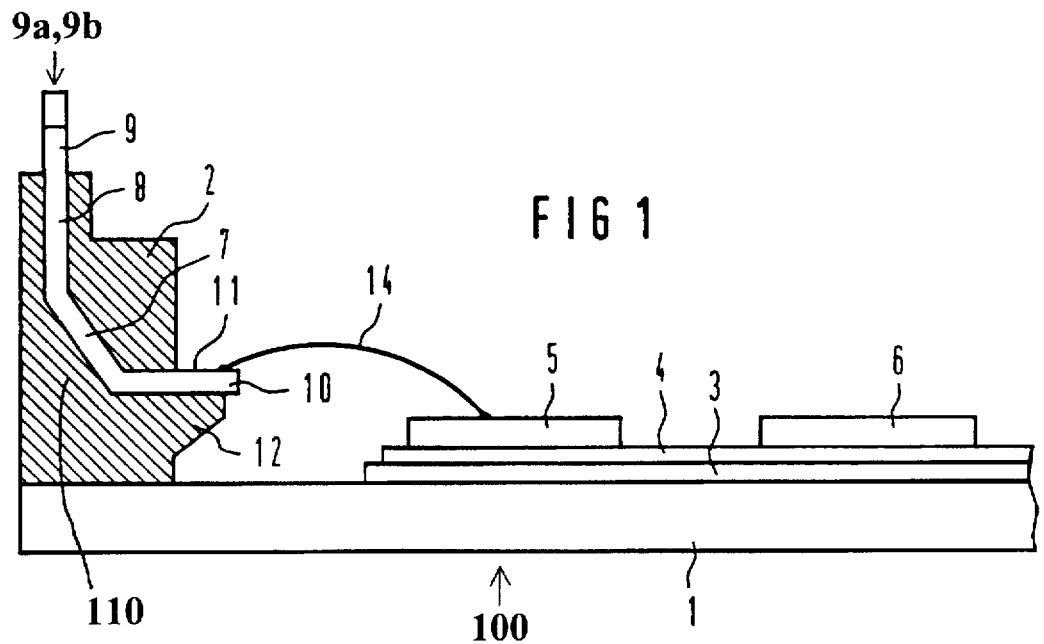
FIG. 1 is a schematic first side view of a power semiconductor module according to the invention.

FIG. 1 shows a power semiconductor module 100 having a metal base 1 that is connected with a housing 110 made of an insulating material. Only one wall 2 of the housing 110 is shown in the section. A ceramic substrate 3, to which printed conductors 4 are attached, sits on the metal base 1. (One of these printed conductors 4 is shown). Semiconductor bodies 5 and 6 are fastened to the printed conductor 4.

The semiconductor module has a terminal element 7, whose center part 8 of the terminal element 7 is enclosed on all sides by the wall 2. The upper part 9 of the terminal element 7 projects from the top of the wall 2. The lower part 10 of the terminal element 7 projects from the inner side of the wall 2. The lower part 10 forms a bonding surface 11, which preferably lies parallel to the surface of the semiconductor body 5, 6. In order to increase mechanical stability, the lower part 10 of the terminal element 7 can be supported by a platform 12. This platform 12 can be part of the housing wall 2 and serves to receive the pressure of the bonder on the bonding surface 11. The bonding surface 11 is connected with the semiconductor body 5 by bonding wires 14, of which only one is shown here for reasons of clarity.

The upper part 9 of the terminal element 7 bears at least two pins. 9a, 9b intended to engage in receptacles of a circuit board. The pins 9a, 9b can easily be produced by being stamped out of the terminal elements. The sum of the cross-sectional area of these pins 9a, 9b is thereby smaller than the cross-sectional area of the terminal element 7 in the center part 8 and in the lower part 10.

Figure 2:
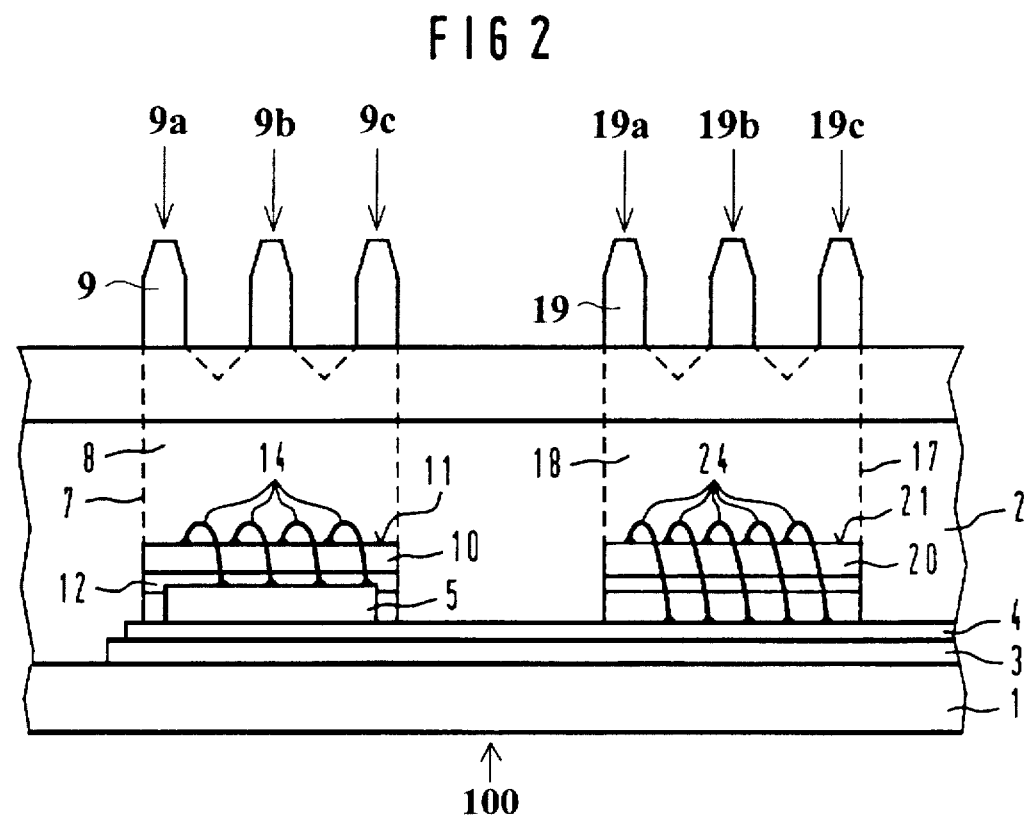
FIG. 2 is a schematic second view of the power semiconductor module.

In FIG. 2, the form of the terminal element 7 with the pins 9a, 9b, 9c is shown in particular. In this case, the upper part 9 of the terminal element 7 has three pins 9a, 9b, 9c, that project from the top of the wall 2. The pins are approximately 1.5 mm wide to 1 mm thick. Their center distance corresponds to a contact spacing of 3.83 mm. The center part 8 of the terminal element 7 is located entirely in the wall 2. Thus, the pins 9a, 9b, 9c, project from the top of the wall 2 and, below, the bonding surfaces 11. For higher currents, the terminal elements 7 can also comprise more than three pins.

Corresponding to the high current carrying capacity of the terminal element 7 and the pins 9a, 9b, 9c, the semiconductor body 5 is connected with the terminal element 7 via a plurality of bonding wires 14 (approximately 10 to 20 bonding wires).

The lower side of the semiconductor body 5 is contacted with a terminal element 17 via the printed conductor 4 by means of bonding wires 24, which terminal element 17 corresponds in its form to the terminal element 7. The terminal element 17 has a center part 18, which is arranged entirely in the wall 2. The upper part 19 of the terminal element 17 has the form of three pins 19a, 19b, 19c, while its lower part 20 lies in parallel to the surface of the semiconductor body 5 and is provided with a bonding surface 21. The bonding surface 21 is electrically connected to the printed conductor 4 via a plurality bonding wires 24.

With a power semiconductor module 100 of the specified type, half-bridges, full bridges, three-phase bridges, etc. can be produced. For a three-phase bridge, five terminal elements are then required for the individual alternating current phases and for the direct current terminals. For other circuits, a corresponding number of terminal elements is provided.

Although modifications and changes may be suggested by those skilled in the art, it is the intention of the inventors to embody within the patent warranted hereon all changes and modifications as reasonably and properly come within the scope of their contribution to the art.

We claim as our invention:

1. A power semiconductor module comprising:

a housing having a housing wall;

a base on which said housing is disposed with said housing wall substantially perpendicular to said base;

a plurality of semiconductor components disposed on said base;

a terminal element having a portion contained in said housing wall, an exposed upper part having at least two terminal pins projecting from said housing wall, each of said at least two terminal pins having a terminal pin cross-section, and an exposed lower part projecting into said housing from said housing wall;

said portion of said terminal element contained in said wall and said lower part having a first cross-section, said first cross-section being larger than a sum of the terminal pin cross-sections of the at least two terminal pins; and means for electrically connecting said lower part of said terminal element to at least one of said semiconductor components.

2. The power semiconductor module in claim 1, wherein said base is comprised of a conductive material.

3. The power semiconductor module in claim 1, wherein said means for electrically connecting said lower part of said terminal element to at least one of said semiconductor components comprises a plurality of bonding wires.

4. The power semiconductor module in claim 1, wherein the distance between said each of said at least two terminal pins is equal to a predetermined contact distance.

5. The power semiconductor module in claim 1, further comprising:

a bonding surface on said exposed lower part that is parallel to a top surface of the semiconductor components.

6. The power semiconductor in claim 1, further comprising:

a platform constructed and arranged under said bonding surface.

7. The power semiconductor module in claim 1 wherein said at least two terminal pins have a thickness equal to a thickness of said portion contained in said housing wall.

8. The power semiconductor in claim 1, wherein said at least two terminal pins are stamped out of said terminal elements.

9. The power semiconductor module in claim 5, further comprising:

a substrate layer on the base;

a plurality of printed conductors arranged on the base and electrically connected to said semiconductor components wherein said bonding surface of said terminal element and one of said printed conductors are connected via a plurality of bonding wires.

10. The power semiconductor module in claim 6, wherein said platform is a part of said housing wall.

11. A power semiconductor module comprising:

a base;

a substrate layer on the base;

a printed conductors attached to the substrate layer;

a plurality of semiconductor components attached to the printed conductor;

a housing constructed and arranged on one end of the metal base having housing walls with an interior surface; and a plurality of terminal elements each having a lower part and an upper part, constructed and arranged in the interior surface of the housing walls such that the upper part projects from the top of the housing and forms at least two terminal pins, and each lower part projects from the side of the housing and is electrically connected to the semiconductor components.

12. The power semiconductor module in claim 11, wherein the base comprised of is a conductive material.

13. The power semiconductor module in claim 11, wherein the substrate layer is cerarmic.

14. The power semiconductor in claim 11, wherein each of the at least two terminal pins has a terminal pin cross section and the terminal elements are constructed and arranged so that a rectangular cross section of the lower part is larger than a sum of the cross sections of each of said at least two terminal pins.

15. The power semiconductor module in claim 11, wherein the distance between each of said at least two terminal pins of each terminal element is equal to a predetermined contact distance.

16. The power semiconductor module in claim 11, further comprising:

a bonding surface on the lower part of each terminal element that is parallel to a top surface of the semiconductor components.

17. The power semiconductor module in claim 11, wherein at least one of the terminal elements and at least one of the semiconductor components are connected via a plurality of bonding wires.

18. The power semiconductor module in claim 11, wherein at least one of the terminal elements and the printed conductor are connected through a plurality of bonding wires.

19. The power semiconductor module in claim 11, further comprising:

a platform constructed and arranged under the bonding surface.

20. The power semiconductor module in claim 19, wherein the platform is a part of the housing.

* * * * *